CONVERTIBLE AMPLIFIER TO PLURAL CHANNEL AND TO PUSH-PULL

Filed Aug. 7, 1956 4 Sheets-Sheet 1

INVENTOR

James R. Macdonald

BY Stevens, Davis, Miller & Mosher
ATTORNEYS

INVENTOR

James R. Macdonald

BY

Stevens, Davis, Miller & Mosher

ATTORNEYS

Sept. 29, 1959 J. R. MACDONALD 2,906,831

CONVERTIBLE AMPLIFIER TO PLURAL CHANNEL AND TO PUSH-PULL

Filed Aug. 7, 1956 4 Sheets-Sheet 3

INVENTOR

*James R. Macdonald*

BY *Stevens, Davis, Miller & Mosher*

ATTORNEYS

Sept. 29, 1959 J. R. MACDONALD 2,906,831

CONVERTIBLE AMPLIFIER TO PLURAL CHANNEL AND TO PUSH-PULL

Filed Aug. 7, 1956 4 Sheets-Sheet 4

INVENTOR

James R. Macdonald

BY Stevens, Davis, Miller & Mosher

ATTORNEYS

United States Patent Office 2,906,831

Patented Sept. 29, 1959

2,906,831

CONVERTIBLE AMPLIFIER TO PLURAL CHANNEL AND TO PUSH-PULL

James Ross Macdonald, Dallas, Tex., assignor to Texas Instruments Incorporated, Dallas, Tex., a corporation of Delaware Application August 7, 1956, Serial No. 602,594

1 Claim. (Cl. 179—171)

This invention relates to an electrical amplifier, and more specifically to an electrical amplifier adapted for easy conversion from a push-pull amplifier into a two-channel amplifier. The principles of this invention are particularly applicable to high fidelity audio amplifiers, but can be applied as well to amplifiers for amplifying other frequencies and amplifiers of lower fidelity.

Because of their cost and the amount of space that they occupy, and sometimes because of their weight, it is often desirable to use a single electrical amplifying system for more than one purpose and, if it could be done, it would be beneficial to use a single amplifying system at one time as a push-pull amplifier and at another time as a two-channel amplifier.

An example of such a situation arises when a sound system is installed in which there is but a single source and a single loud speaker. In this case, a push-pull amplifier may be exactly what is wanted. Later, a pair of speakers may be installed, at which time it may be advantageous to use a two-channel amplifier, fed from a single signal source, but with each channel supplying its separate amplifier. This avoids the necessity for a relatively low-impedance, cross-over network at the output of the amplifier and permits the use of a high-impedance, cross-over network at the input of the amplifiers. Again, a change may be made in the sound system so as to use a binaural input with one input signal going to each of the two channels of the amplifier and each channel feeding its own loudspeaker. There are many other circumstances in which the desirability of being able to convert an amplifying system from a push-pull to two-channel operation will be obvious, but the foregoing is a sufficient example.

In accordance with this invention, a single electrical amplifying system is provided, the circuit for this amplifying system being such that it may be converted by relatively simple switching from a push-pull amplifier into a two-channel amplifying system, and vice versa.

Basically, this invention comprises a combination of the parts normally found in a push-pull amplifier along with the parts normally found in a two-channel amplifier, but without any substantial duplication. These parts are arranged in a circuit with appropriate switching means so that the circuit can be converted from a push-pull circuit to a two-channel circuit, and back, simply by the operation of the switching means.

Further details and advantages of this novel switching arrangement will be apparent from a consideration of the appended drawings and the following description, which illustrate and describe the preferred embodiment of the invention. It is to be understood, however, that many modifications and changes in detail may be made within the scope of this invention and that the illustration given hereinafter is simply for the purposes of illustration, and not limitation.

Figure 1:
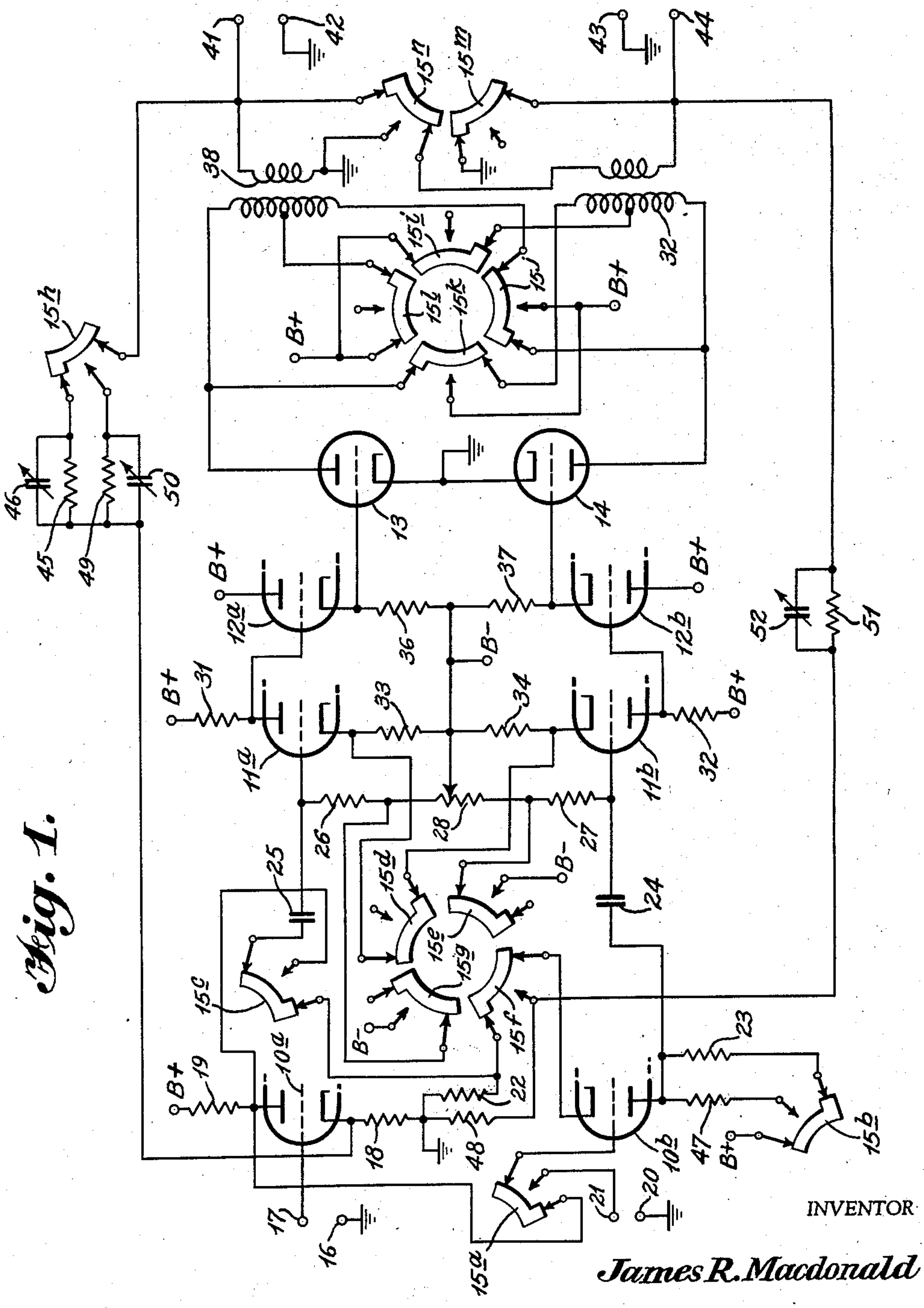
Figure 1 is a circuit diagram of an amplifier constructed in accordance with the principles of this invention, and with the switching mechanism set so that the amplifier will operate as a push-pull amplifier.
Figure 2:
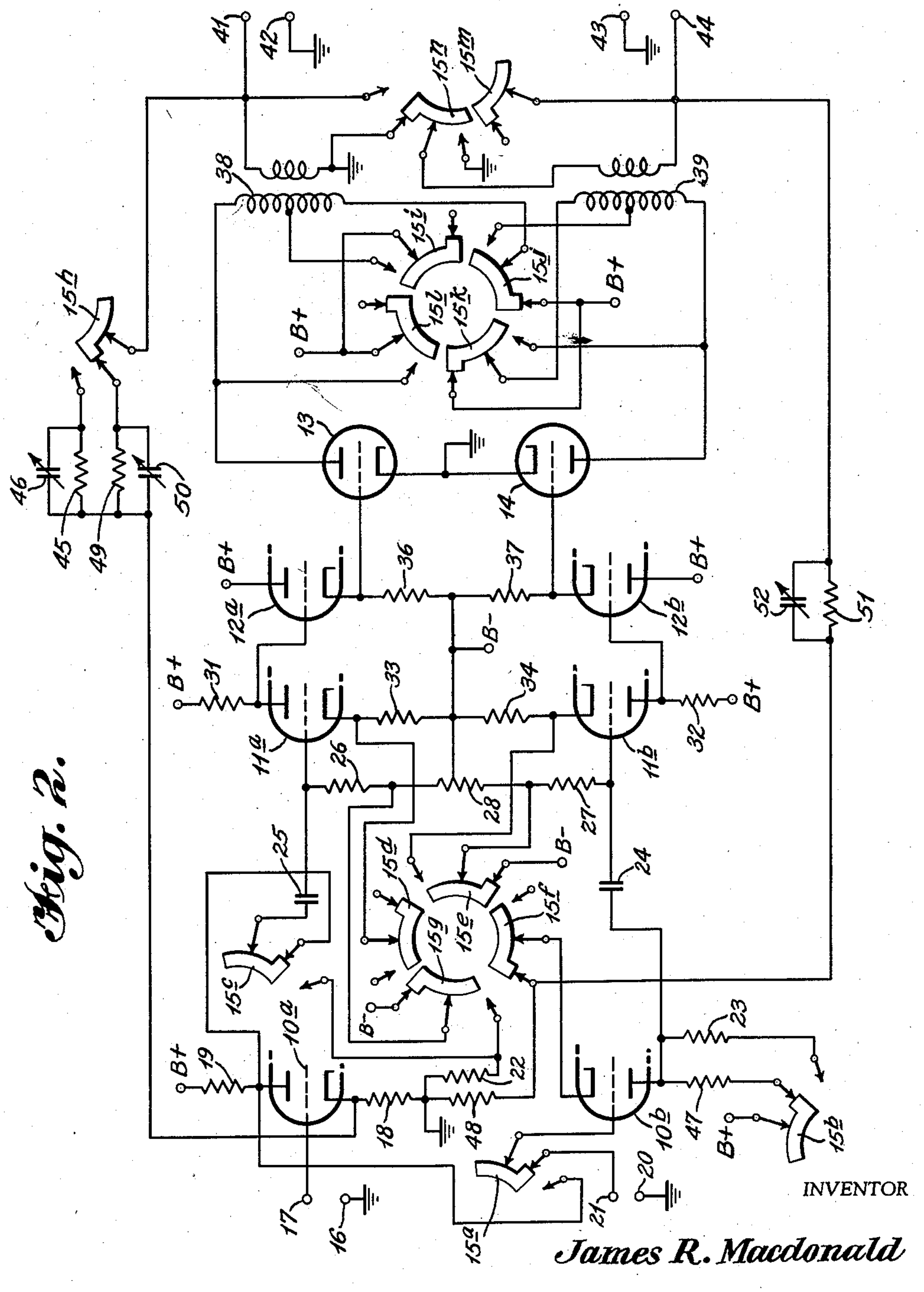
Figure 2 is a circuit diagram of the same amplifier with the switching mechanism set so that the amplifier will operate as a two-channel amplifier.

As illustrated in Figure 1, the amplifier of this invention may be constructed so as to utilize three dual triode thermionic amplifier tubes, 10*a* and 10*b*, 11*a* and 11*b*, and 12*a* and 12*b*, and a pair of single triode amplifier tubes 13 and 14. A rotatable, multiple-contact switch 15*a, b, c, d, e, f, g, h, i, j, k, l, m, n*, may be used to convert the circuit from a push-pull circuit to a dual-channel circuit. The parts of this switch have been shown scattered about the circuit diagram for convenience, but ordinarily will all comprise a single two-position, multiple-contact switch. In one position, the switch will make contacts as shown in Figure 1 and in the other position it will make contacts as shown in Figure 2.

Figure 3:
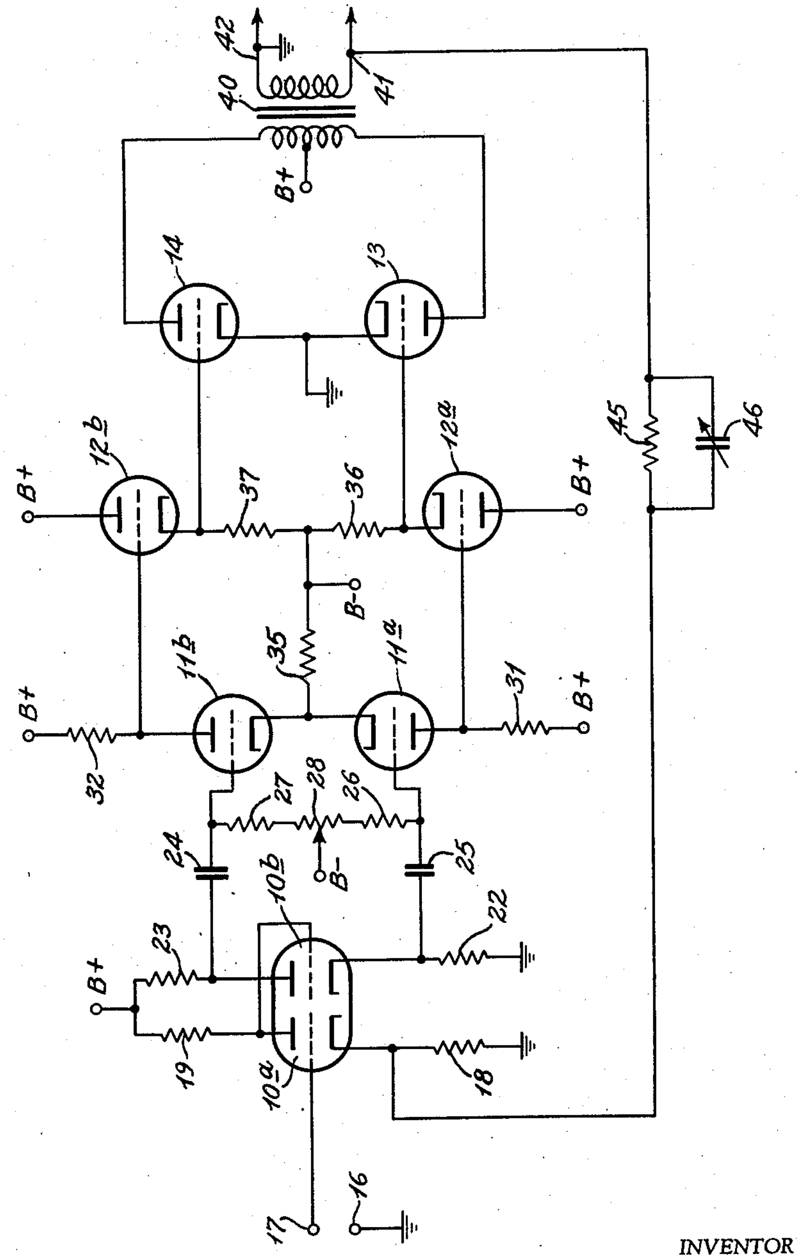
Figure 3 is a circuit diagram of the same amplifier, connected as a push-pull amplifier, but with the switching mechanism and inactive parts eliminated so as to simplify the circuit diagram.

As illustrated in Figures 1 and 3, the amplifier is connected for single-channel push-pull operation. The input signal which is received at terminals 16 and 17 is applied between ground and the grid of the triode 10*a*. The cathode of triode 10*a* is grounded through a bias resistor 18 and supplied with plate potential by a plate resistor 19 from a potential source not shown. The output signal goes directly through a switch segment 15*a* to the grid of the second half of the first triode 10*b*. A second pair of input leads 20 and 21 are not used in the push-pull connection.

The cathode of the second triode 10*b* is grounded through a switch segment 15*f* and a bias resistor 22, while the plate of this tube is supplied with plate potential through a plate resistor 23, which is connected through a switch segment 15*b* to a source of plate potential not shown. The plate of the second triode 10*b* is connected through a condenser 24 to the grid of the second half of the second dual triode 11*b*, and the cathode of the second triode 10*b* is connected through switch segment 15*f*, which segment 15*c*, and a condenser 25 to the grid of the first half of the second triode 11*a*. At this point is should be noted that resistors 22 and 23 preferably are of the same value of resistance in order that the signal level to the grids of both triode halves, 11*a* and 11*b*, will be substantially equal. A bridge is formed between the grids of the two halves of the dual triode 11*a* and 11*b* by two fixed resistors 26 and 27 and a potentiometer 28, all connected in series. The slider of the potentiometer 28 is connected to a source of negative bias voltage, not shown and thus the operation of the potentiometer 28 will adjust the relative potentials of the two grids. Plate potential is supplied to the plates of the two halves 11*a* and 11*b* of the second dual triode through plate resistors 31 and 32, respectively, from a plate potential source not shown. The cathodes of triode halves 11*a* and 11*b* are directly connected to a common point of negative potential through switch segment 15*d*. This connection shorts out series resistors 33 and 34, which also connect the cathodes of triode halves 11*a* and 11*b*. Furthermore, since the point of connection between resistors 33 and 34 is connected to the negative bias voltage, the cathodes of triodes 11*a* and 11*b* are biased by the parallel combination of resistors 33 and 34 (shown as a single equivalent resistor 35 in Figure 3).

The output signals of the second dual triode are carried directly from the plates of the two triodes 11*a* and 11*b* to the grids of the two triodes 12*a* and 12*b*, respectively, which constitute the two halves of the third dual triode. The plates of triode halves 12*a* and 12*b* are connected directly to the source of plate potential not shown, while the cathodes are connected to series resistors 36 and 37, with the point of connection between resistors 36 and 37 being connected to the negative bias voltage. The third dual triode is employed as two cathode followers so that the cathode output of triode half 12*a* drives the grid of a triode 13, and the cathode output of triode half 12*b* drives the grid of a triode 14, triodes 13 and 14 providing the basis for the fourth and final stage of amplification. The cathodes of triodes 13 and 14 are directly grounded.

The plate of triode 13 is connected through switch segment 15*k* to one end of the primary of output transformer 39, the other end of the primary of transformer 39 being connected to the plate of triode 14. In a similar manner, the plate of triode 14 is connected through switch segment 15*j* to one end of the primary of output transformer 38, the other end of the primary of transformer 38 being connected to the plate of triode 13. Center taps on the primaries of transformers 38 and 39 are connected through switch segments 15*l* and 15*i*, respectively, to a source of positive plate potential not shown. The net effect is that two output transformers in parallel (shown as a single-equivalent transformer 40 in Figure 3) are connected across triodes 13 and 14.

The output from the push-pull amplifier is taken between terminal 41 and ground terminal 42, which are connected across the secondary of transformer 38. Terminal 41 is connected by means of switch segment 15*n* to one end of the secondary of transformer 39, while the other end of the secondary of transformer 39 is grounded through switch segment 15*m*. The result is that output terminals 41 and 42 are supplied by transformer 39 as well as transformer 38. A second pair of output terminals 43 and 44 are shorted out by switch segment 15*m*. Feedback for the push-pull amplifier is accomplished by means of a feedback resistor 45 connected in parallel with a variable condenser 46, the parallel RC combination being in series with switch segment 15*h*, so as to connect the secondary of transformer 38 with the cathode of first triode half 10*a*. The values of resistor 45 and condenser 46 are such as to provide the desired feedback for push-pull operation.

When the rotatable multiple contact switch 15*a, b, c, d, e, f, g, h, i, j, k, l, m, n* is thrown so as to rotate all the switch segments counterclockwise, thus breaking the connections shown in Figure 1 and at the same time forming the connections shown in Figure 2, the system becomes converted into a dual-channel amplifier which operates as two separate and complete amplifiers. The first amplifier is constructed around triode halves 10*a*, 11*a*, 12*a*, and single triode 13, while the second amplifier uses triode halves 10*b*, 11*b*, 12*b*, and single triode 14.

Figure 4:
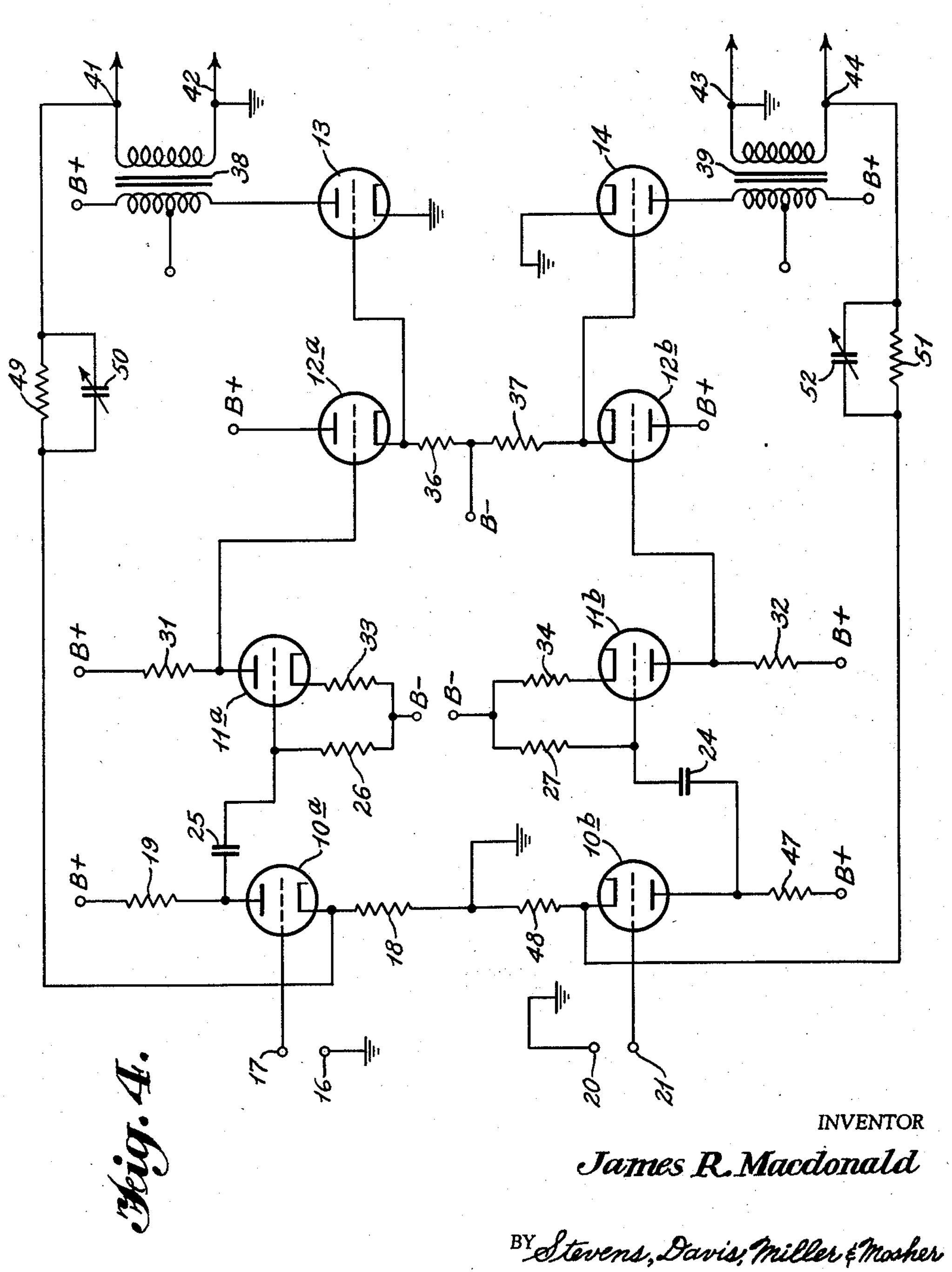
Figure 4 is a similar circuit diagram of the amplifier of this invention connected as a two-channel amplifier, again with the switching mechanism and inactive parts eliminated for simplification.

As shown in Figures 2 and 4, the input for the first amplifier is applied across terminals 16 and 17 between the grid of first diode half 10*a* and ground, while the input for the second amplifier is applied across terminals 21 and 20 between the grid of second triode half 10*b* and ground, since switch segment 15*a* now connects terminal 21 directly to the grid of triode 10*b*, leaving the plate of triode 10*a* disconnected from the grid of triode 10*b*. The plate of triode 10*a* remains biased by plate resistor 19 from a source of potential not shown, while the cathode is grounded through bias resistor 18. The alternate position of switch segment 15*b* leaves the plate of triode 10*b* biased through a plate resistor 47 from a source of potential not shown, with resistor 23 being disconnected from the potential source.

The movement of switch segment 15*f* disconnects resistor 22 from the cathode of triode 10*b*, and connects in its place a cathode bias resistor 48. Furthermore, switch segment 15*c* is now positioned so as to disconnect condenser 25 from resistor 22, leaving the plate of first triode half 10*a* connected through switch segment 15*c* and condenser 25 to the grid of second triode half 11*a*. Also, the plate of first triode half 10*b* is coupled to the grid of second triode half 11*b* through condenser 24.

Switch segment 15*g* now connects the grid of triode half 11*a* to the negative bias source through resistor 26, while the grid of triode half 11*b* is similarly connected through resistor 27 and switch segment 15*e*. Potentiometer 28 is thus shorted out. In addition, the movement of switch segment 15*d* removes the short circuit between the cathodes of triodes 11*a* and 11*b*, leaving the cathodes connected by series resistors 33 and 34, with the point connecting these resistors being connected to negative voltage so as to provide bias for the cathode. As in the push-pull connection, the plates of triode halves 11*a* and 11*b* are biased through resistors 31 and 32, respectively, from a source of potential not shown, and the plate outputs from the triodes 11*a* and 11*b* are used to drive the grids of third triode halves 12*a* and 12*b*, respectively.

The third triode halves 12*a* and 12*b* are connected exactly as before. The plates are biased from a source of potential not shown, the cathodes are grounded through resistors 36 and 37, and the cathode follower outputs are used to drive the grids of triodes 13 and 14.

The cathodes of triodes 13 and 14 remain connected to the negative bias voltage but the plate connections are changed substantially by switch segments 15*i, j, k, l*. Switch segment 15*k* now disconnects the plate of triode 13 from the primary of transformer 39 and at the same time biases the end of the primary of transformer 39 away from triode 14 to a source of plate potential not shown. In a similar manner, the new position of switch segment 15*j* leaves the plate of triode 14 disconnected from the primary of transformer 38 and also biases the end of the primary of transformer 38 away from triode 13 to a source of potential not shown. Switch segments 15*i* and 15*l* disconnect the center taps on transformers 39 and 38, respectively, from the above-mentioned potential source.

Switch segment 15*m* serves to disconnect terminal 44 of the secondary of transformer 39 from ground, while switch segment 15*n* now leaves the other end of the secondary of transformer 39 disconnected from terminal 41 and grounded instead. This arrangement provides a separate output for each amplifier, the output for the first amplifier being taken from the secondary of transformer 38 across terminals 41 and 42 and the output for the second amplifier being taken from the secondary of transformer 39 across terminals 43 and 44.

Feedback for the first amplifier is accomplished by means of parallel resistor 49 and variable condenser 50, which connect the output terminal 42 to the cathode of triode 10*a*. The position of switch segment 15*h* is changed so as to disconnect resistor 45 and condenser 46 and to connect resistor 49 and capacitor 50. This changes the resistance and capacitance values in the feedback network for the first amplifier so that the feedback will be of the desired value for the operation of the first single amplifier, a value different from that needed for push-pull operations.

Parallel resistor 51 and variable condenser 52 are connected from output terminal 44 to the cathode of triode half 10*b* by means of switch segment 15*f* in order to provide feedback for the second single amplifier. In push-pull operation, the position of switch segments 15*f* and 15*m* serves to short out feedback resistor 51 and condenser 52 along with cathode resistor 48, in order to make feedback for the second single amplifier inoperative.

Thus, when the switch segments are in the position shown in Figure 2, the system is set for operation as two independent and complete amplifiers, each with its own input and output. When the switch is operated so as to return the switch segments to the position shown in Figure 1, the system once again is available for use as a single-channel, push-pull amplifier. This novel switching arrangement is thus seen to provide either two amplifiers or a single amplifier in substantially one amplifying circuit. At the same time, switching from push-pull to dual-channel operation can be carried out in a most simple and convenient manner.

Although the present invention has been shown and described with reference to a particular embodiment, nevertheless, various changes and modifications obvious to one skilled in the art are within the spirit, scope and contemplation of the present invention.

What is claimed is:

A combination comprising first, second, third, and fourth vacuum tubes each having a plate, a grid, and a cathode, a first pair of input terminals, a second pair of input terminals, first and second pairs of output terminals, one output terminal of each of said pairs of output terminals being connected to a common reference potential, and selective circuit means to connect in one position said first, second, third and fourth vacuum tubes, said first and second pairs of input terminals, and said first and second pairs of output terminals as two separate channels of amplification with said first and third vacuum tubes comprising the first and second stages of amplification, respectively, of one channel and said second and fourth vacuum tubes comprising the first and second stages of amplification, respectively, of the other channel, said selective circuit means operable alternatively to connect in a second position said first, second, third, and fourth vacuum tubes, one pair of said input terminals, and one pair of said output terminals as a push-pull amplifier with said first vacuum tube connected as a preamplification stage, said second vacuum tube connected to generate two oppositely phased signals from its cathode and plate and said third and fourth vacuum tubes connected in a push-pull arrangement, said selective circuit means comprising first and second impedance connecting the cathodes of said third and fourth tubes, respectively, to a common reference potential, means providing power to all of said vacuum tubes between their plates and a common reference potential, means for applying the signal applied across said first pair of input terminals between the grid and common reference potential of said first tube, means for applying the signal generated at the plate of said second vacuum tube to the grid of said fourth vacuum tube, and switch means applying in a first position the signal applied across said second pair of input terminals between the grid and common reference potential of said second vacuum tube, the signal generated at the plate of said first tube to the grid of said third tube, the signal generated between the plate and common reference potential of said third tube across said first pair of output terminals, the signal generated between the plate and common reference potential of said fourth tube across said second pair of output terminals, said switch means applying in a second position the signal generated at the cathode of said second tube to the grid of said third tube, the signal generated at the plate of said first tube to the grid of said second tube, and the signal generated between the plates of said third and fourth tubes across the two of said output terminals which are not connected to a common reference potential, said switch means connecting in said second position the cathodes of said third and fourth tubes together.

References Cited in the file of this patent

UNITED STATES PATENTS

| | | |
|---|---|---|
| 2,088,432 | Peterson | July 27, 1937 |
| 2,186,146 | Plebanski | Jan. 9, 1940 |
| 2,684,278 | Marchand | July 20, 1954 |
| 2,706,265 | Buehler | Apr. 12, 1955 |
| 2,761,019 | Hall | Aug. 28, 1956 |

FOREIGN PATENTS

| | | |
|---|---|---|
| 670,010 | Great Britain | Apr. 9, 1952 |